United States Patent
Kim (10) Patent No.: US 10,600,834 B2
(45) Date of Patent: Mar. 24, 2020

(54) IMAGE SENSOR CAPABLE OF IMPROVING COLOR SHADING EFFECT

(71) Applicant: SK hynix Inc., Gyeonggi-do (KR)

(72) Inventor: Sang-Sik Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/800,388

(22) Filed: Nov. 1, 2017

(65) Prior Publication Data

US 2018/0277581 A1 Sep. 27, 2018

(30) Foreign Application Priority Data

Mar. 21, 2017 (KR) .................. 10-2017-0035289

(51) Int. Cl.
*H01L 27/146* (2006.01)
(52) U.S. Cl.
CPC .. *H01L 27/14621* (2013.01); *H01L 27/14627* (2013.01); *H01L 27/14645* (2013.01)
(58) Field of Classification Search
CPC ......... H01L 27/14621; H01L 27/14645; H01L 27/14627; H01L 27/146
USPC ........................................................ 257/432
See application file for complete search history.

(56) References Cited

U.S. PATENT DOCUMENTS

| 6,690,049 | B2 | 2/2004 | Suzuki et al. |
| 7,629,662 | B2 | 12/2009 | Lee |
| 8,134,633 | B2 | 3/2012 | Watanabe |
| 8,576,277 | B2 * | 11/2013 | Kim ................ G02B 27/2214 348/59 |
| 8,736,731 | B2 * | 5/2014 | Noudo ............... H01L 27/1464 348/302 |
| 8,913,165 | B2 | 12/2014 | Okigawa |
| 8,970,748 | B2 * | 3/2015 | Hayashi ................ H04N 9/045 348/275 |
| 9,071,781 | B2 * | 6/2015 | Suzuki ............ H01L 27/14643 |
| 9,484,377 | B2 | 11/2016 | Won et al. |
| 10,199,421 | B2 * | 2/2019 | Choi ................ H01L 27/14638 |
| 2004/0100570 | A1 * | 5/2004 | Shizukuishi ........... H04N 9/045 348/272 |
| 2008/0030603 | A1 * | 2/2008 | Masuno ................ H04N 9/045 348/273 |
| 2009/0078974 | A1 * | 3/2009 | Nagai ............... H01L 27/14625 257/292 |
| 2011/0049661 | A1 * | 3/2011 | Maehara ............... H01L 27/307 257/432 |
| 2011/0090242 | A1 * | 4/2011 | Cote ..................... G06T 3/4015 345/597 |
| 2011/0187902 | A1 * | 8/2011 | Adams, Jr. ............. G06T 5/002 348/241 |

(Continued)

*Primary Examiner* — Alexander O Williams
(74) *Attorney, Agent, or Firm* — IP & T Group LLP (57) ABSTRACT

An image sensor includes: a pixel array where a plurality of pixel groups are arrayed in two dimensions, wherein each of the plurality of the pixel groups includes: a first pixel suitable for sensing a first color signal that is color-separated through a first color filter; and a second pixel suitable for sensing a second color signal that is color-separated through a second color filter and has a longer wavelength than the first color signal, and a volume of a first color filter or a second color filter that is positioned in a peripheral area of the pixel array is different from a volume of a first color filter or a second color filter that is positioned in a central area of the pixel array.

13 Claims, 11 Drawing Sheets

(56) References Cited

U.S. PATENT DOCUMENTS

| | | | |
|---|---|---|---|
| 2011/0188748 A1* | 8/2011 | Adams, Jr. | H04N 9/045 |
| | | | 382/167 |
| 2012/0105691 A1* | 5/2012 | Waqas | G06T 3/4015 |
| | | | 348/280 |
| 2013/0076939 A1* | 3/2013 | Kaizu | H04N 9/045 |
| | | | 348/224.1 |
| 2015/0035109 A1* | 2/2015 | Kataoka | H01L 27/14634 |
| | | | 257/443 |
| 2015/0070544 A1* | 3/2015 | Smith | H01L 27/14641 |
| | | | 348/297 |
| 2015/0256778 A1* | 9/2015 | Kusaka | G03B 13/36 |
| | | | 348/302 |
| 2015/0357357 A1* | 12/2015 | Sargent | H04N 5/378 |
| | | | 250/208.1 |
| 2016/0027838 A1* | 1/2016 | Park | H01L 27/14645 |
| | | | 257/440 |
| 2017/0070689 A1* | 3/2017 | Silverstein | H04N 5/3572 |
| 2017/0092672 A1* | 3/2017 | Ungnapatanin | H01L 27/14605 |
| 2017/0330905 A1* | 11/2017 | Tak | H01L 27/1462 |
| 2018/0059538 A1* | 3/2018 | Yomori | G03F 7/0007 |

\* cited by examiner

IMAGE SENSOR CAPABLE OF IMPROVING COLOR SHADING EFFECT

CROSS-REFERENCE TO RELATED APPLICATIONS

The present application claims priority of Korean Patent Application No. 10-2017-0035289, filed on Mar. 21, 2017, which is herein incorporated by reference in its entirety.

BACKGROUND

1. Field

Exemplary embodiments of the present invention relate to a semiconductor device, and more particularly, to an image sensor capable of improving a color shading effect.

2. Description of the Related Art

An image sensor is a device capable of converting an optical image into electrical signals. An image sensor may include a plurality of pixels, for example, a plurality of red pixels, a plurality of green pixels, and a plurality of blue pixels, which are arrayed in a two-dimensional structure.

Figure 1A:
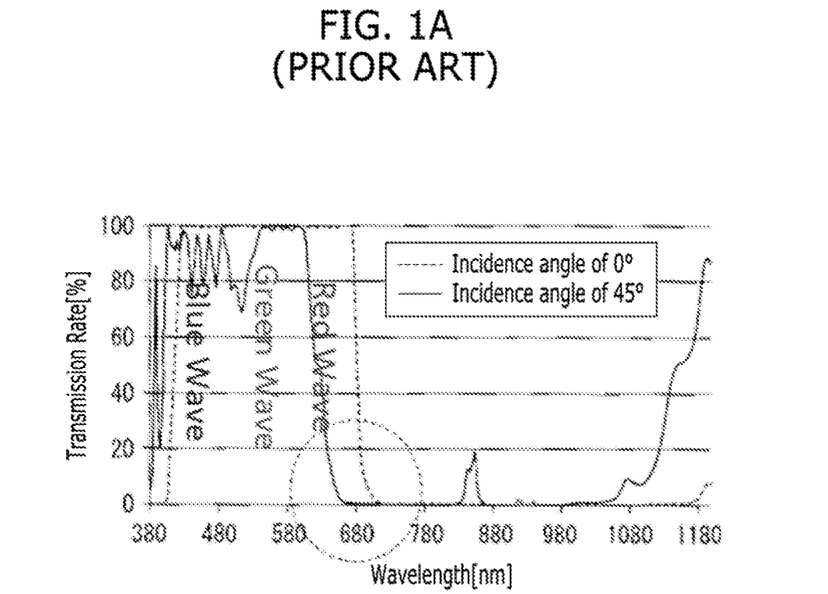
FIG. 1A is a graph illustrating cut-off characteristics for each wavelength according to an incidence angle of an infrared cut-off filter.
Figure 1B:
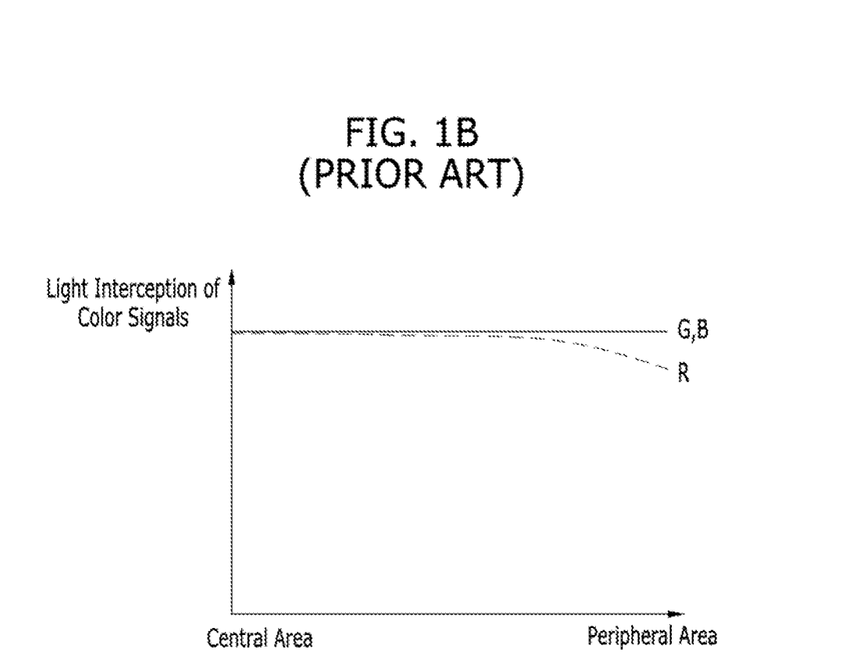
FIG. 1B is a graph illustrating light receiving rate for each color signal of incident light (IL) according to a position in a pixel array of an image sensor.

FIG. 1A is a graph showing cut-off characteristics for each wavelength according to an incidence angle of an infrared cut-off filter, and FIG. 1B is a graph showing light receiving rate for each color signal of incident light (IL) according to a position in a pixel array of an image sensor.

In general, red color signals have a wavelength ranging from approximately 620 nm to approximately 780 nm, green color signals have a wavelength ranging from approximately 490 nm to approximately 570 nm, and blue color signals have a wavelength ranging from approximately 450 nm to approximately 490 nm.

Referring to FIG. 1A, the red color signals show much difference in wavelength that is cut off by an infrared cut-off filter according to incidence angles. When the incidence angle of the red color signals is 0 degree (°), the infrared cut-off filter may cut off red color signals having a wavelength of approximately 680 nm or more and pass red color signals having a wavelength of less than approximately 680 nm. When the incidence angle of the red color signals is 45 degrees (°), the infrared cut-off filter may cut off red color signals having a wavelength of approximately 620 nm or more and pass red color signals having a wavelength of less than approximately 620 nm.

Referring to FIG. 1B which is an example of an image sensor that includes a central area and a peripheral area, in which the light receiving rate of the red color signals is remarkably decreased due to the cut-off characteristics of the infrared cut-off filter being as close to the peripheral area where the incidence angle of light is greater than the incidence angle in the central area, compared with other color signals. Therefore, an imbalance occurs due to the difference in the light receiving rate, which causes a color shading effect.

SUMMARY

Embodiments of the present invention are directed to an image sensor with improved performance.

In accordance with an embodiment of the present invention, an image sensor includes: a pixel array where a plurality of pixel groups are arrayed in two dimensions, wherein each of the plurality of the pixel groups includes: a first pixel suitable for sensing a first color signal that is color-separated through a first color filter; and a second pixel suitable for sensing a second color signal that is color-separated through a second color filter and has a longer wavelength than the first color signal, and a volume of a first color filter or a second color filter that is positioned in a peripheral area of the pixel array is different from a volume of a first color filter or a second color filter that is positioned in a central area of the pixel array.

The first color filter positioned in the peripheral area of the pixel array may have a greater volume than the first color filter positioned in the central area of the pixel array.

The first color filter positioned in the peripheral area of the pixel array may be thicker than the first color filter positioned in the central area of the pixel array.

A volume of the second color filter positioned in the peripheral area of the pixel array may be the same as a volume of the second color filter positioned in the central area of the pixel array.

The image sensor may further include: a photoelectric conversion device that is formed in a lower portion of the first color filter; and a first buffer layer that is formed between the first color filter and the photoelectric conversion device, includes a concave and convex pattern contacting a lower surface of the first color filter that is positioned in the peripheral area, and includes a material having a refraction index which is different from a refraction index of the first color filter.

The image sensor may further include: a micro lens that is formed in an upper portion of the first color filter; and a second buffer layer that is formed between the first color filter and the micro lens, includes a concave and convex pattern contacting an upper surface of the first color filter that is positioned in the peripheral area, and includes a material having a refraction index which is different from a refraction index of the first color filter.

The peripheral area may include a first peripheral area where a first incident light enters at a first incidence angle and a second peripheral area where a second incident light enters at a second incidence angle, which is greater than the first incidence angle, and a volume of the first color filter that is formed in the second peripheral area may be greater than a volume of the first color filter that is formed in the first peripheral area.

The peripheral area may include a first peripheral area where a first incident light enters at a first incidence angle and a second peripheral area where a second incident light enters at a second incidence angle, which is greater than the first incidence angle, and a total volume of convex patterns of the concave and convex pattern formed in the second peripheral area may be smaller than a total volume of convex patterns of the concave and convex pattern formed in the first peripheral area, and a volume of the first color filter that is formed in the second peripheral area may be greater than a volume of the first color filter that is formed in the first peripheral area.

The second color filter positioned in the peripheral area of the pixel array may have a smaller volume than the second color filter positioned in the central area of the pixel array.

The second color filter positioned in the peripheral area of the pixel array may have a smaller volume than the second color filter positioned in the central area of the pixel array.

A volume of the first color filter positioned in the peripheral area of the pixel array may be the same as a volume of the first color filter positioned in the central area of the pixel array.

A thickness of the first color filter positioned in the peripheral area of the pixel array may be the same as a thickness of the first color filter positioned in the central area of the pixel array.

The image sensor may receive an incident light from an infrared cut-out filter.

In accordance with another embodiment of the present invention, an image sensor includes: a pixel array having a plurality of pixel groups are arrayed in two dimensions, wherein each of the plurality of the pixel groups includes: a first pixel suitable for sensing a first color signal that is color-separated through a first color filter; and a buffer layer that includes a concave and convex pattern contacting an upper surface or a lower surface of a first color filter which is positioned in a peripheral area of the pixel array and is formed of a material having a refraction index different from a refraction index of a material of the first color filter, and a volume of the first color filter that is positioned in the peripheral area of the pixel array may be greater than a volume of a first color filter that is positioned in a central area of the pixel array.

A thickness of the first color filter positioned in the peripheral area of the pixel array may be greater than a thickness of the first color filter positioned in the central area of the pixel array.

The peripheral area may include a first peripheral area where a first incident light enters at a first incidence angle and a second peripheral area where a second incident light enters at a second incidence angle, which is greater than the first incidence angle, and a volume of the first color filter that is formed in the second peripheral area may be greater than a volume of the first color filter that is formed in the first peripheral area.

A total volume of convex pattern of the concave and convex pattern of the buffer layer contacting the upper surface or the lower surface of the first color filter that is positioned in the second peripheral area may be smaller than a total volume of convex pattern of the concave and convex pattern of the buffer layer formed in the first peripheral area.

The image sensor of claim 15, wherein each of the plurality of the pixel groups may further include: a second pixel suitable for sensing a second color signal that is color-separated through a second color filter and has a longer wavelength than the first color signal, and a volume of a second color filter that is positioned in the peripheral area of the pixel array is the same as a volume of a second color filter that is positioned in a central area of the pixel array.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The following embodiments of the present invention provide an image sensor with improved performance. Herein, the image sensor with improved performance is an image sensor capable of improving a color shading effect.

Before the embodiments of the present invention are described, a conventional image sensor is described. An image sensor is a semiconductor device that converts an optical image into electrical signals. Image sensors may be largely divided into Charge-Coupled Device (CCD) image sensors and CMOS (Complementary Metal Oxide Semiconductor) image sensors. The CMOS image sensors are easy to operate and capable of adopting diverse scanning schemes, compared with the CCD image sensors. Also, since the CMOS image sensors are capable of integrating circuits for processing signals that are outputted from pixels into one chip through a CMOS fabrication process, they are favorable for miniaturizing product sizes and reducing production costs while consuming a small amount of power. For this reason, researchers and the industry are studying to develop CMOS image sensors. CMOS image sensors may also be divided into a front-side illumination type and a back-side illumination type. The technological concept of the present invention may be applied to both of the front-side illumination type and the back-side illumination type. It is known, however, that the back-side illumination type has superior operation characteristics for example, sensitivity, to the front-side illumination type. Therefore, the embodiments of the present invention, which will be described in detail hereafter, are described by taking a back-side illumination type of a CMOS image sensor as an example. Also, in order to increase the volume of a color filter in the embodiments of the present invention, the thickness of the color filter may be increased, or a concave and convex pattern may be formed in an upper portion and/or a lower portion of the color filter.

Figure 2A:
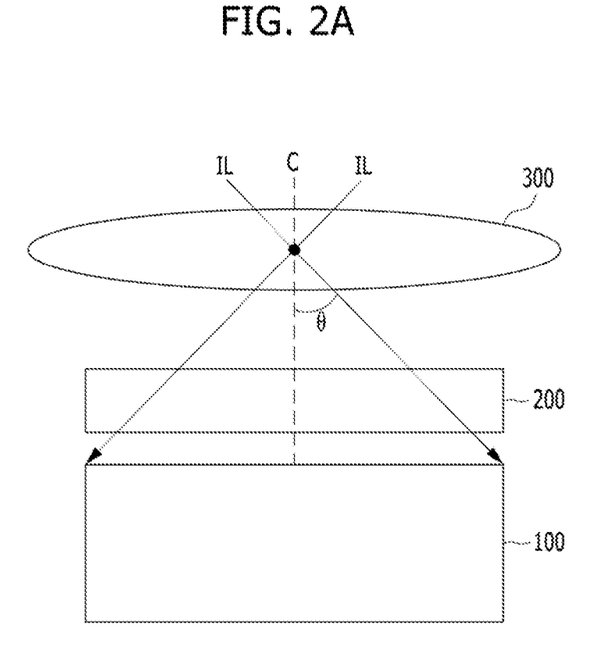
FIGS. 2A and 2B are a cross-sectional view and a plane view illustrating an image sensor system in accordance with an embodiment of the present invention.
Figure 2B:
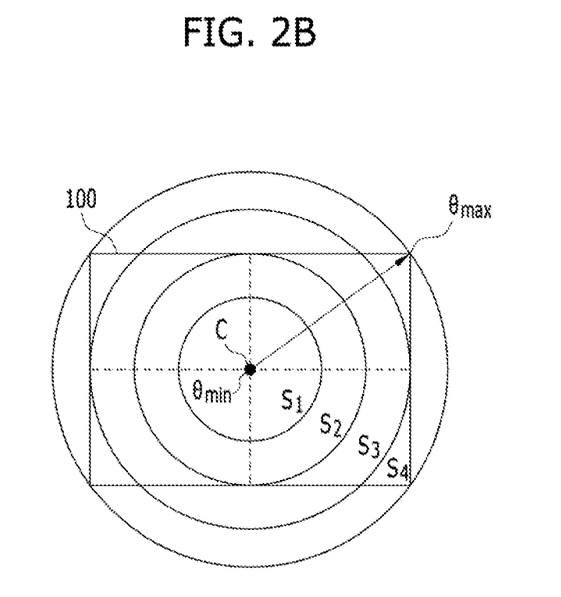

FIGS. 2A and 2B are a cross-sectional view and a plane view illustrating an image sensor system in accordance with an embodiment of the present invention.

Referring to FIG. 2A, the image sensor system in accordance with the embodiment of the present invention may include an image sensor 100, an infrared cut-off filter 200, and a module lens 300. The module lens 300 may pass incident light (IL) to the infrared cut-off filter 200 and the image sensor 100. The infrared cut-off filter 200 may be disposed between the module lens 300 and the image sensor 100, and may cut off infrared ray from the incident light (IL) while passing the remainder of the incident light (IL) to a micro lens (not shown) of the image sensor 100. The image sensor 100 may convert the incident light (IL) that is received from the infrared cut-off filter 200 into electrical signals.

Referring to FIGS. 2A and 2B, the image sensor 100 may receive the incident light (IL) at an incidence angle (θ). The incidence angle (θ) is an angle between an optical axis (C) and the incident light (IL). The image sensor 100 in accordance with the embodiment of the present invention may include a plurality of peripheral areas, for example, first to fourth peripheral areas S1, S2, S3 and S4, according to the distance from the optical axis (C). The first peripheral area S1 closest to the optical axis (C) may be referred to as a central area of a pixel array of the image sensor 100, and the second to fourth peripheral areas S2, S3 and S4 may be referred to as a peripheral area of the pixel array. The incidence angle (θ) may increase as it goes from the central area of the pixel array to the peripheral area of the pixel array. The incidence angle (θ) may have a minimal value (θmin) of approximately 0 degree at the optical axis (C) corresponding to the first peripheral area S1, and the incidence angle (θ) may have a maximal value (θmax) at an edge of the peripheral area of the pixel array corresponding to the fourth peripheral area S4.

Figure 3:
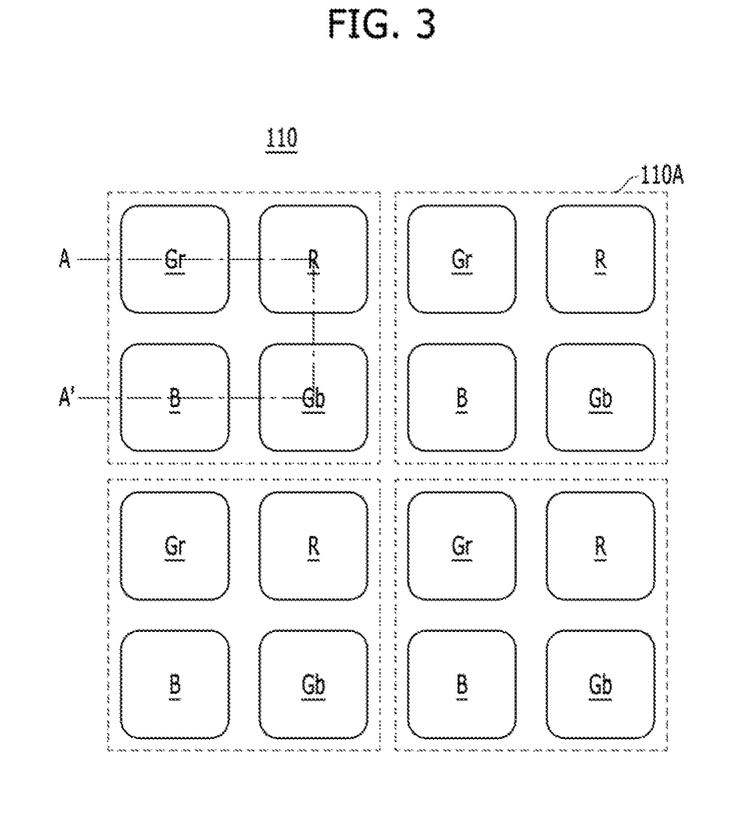
FIG. 3 is a plane view illustrating a portion of a color filter array of an image sensor in accordance with an embodiment of the present invention.

FIG. 3 is a plane view illustrating a portion of a color filter array of the image sensor 100 in accordance with an embodiment of the present invention. Specifically, FIG. 3 is a plane view illustrating a plurality of color filter arrays 110 corresponding to the pixel array of the image sensor 100 illustrated in FIGS. 2A and 2B.

The image sensor 100 may include the color filter arrays 110 which corresponds to the pixel arrays. Each of the color filter arrays 110 may include a plurality of pixel groups 110A that are arrayed in a two-dimensional structure. Each of the pixel groups 110A may include a Bayer pattern where a first green color filter Gr and a red color filter R of a red line and a second green color filter Gb and a blue color filter B of a blue line are disposed. Particularly, the light receiving rate of red color signals may be decreased in the pixel arrays that are disposed in the peripheral areas S2, S3 and S4 of the image sensor 100, compared with the light receiving rate of blue color signals and green color signals. Therefore, the light receiving rate of the plurality of color signals becomes imbalanced, which causes a color shading effect.

In order to reduce the color shading effect caused in the peripheral area of the pixel arrays of the image sensor 100, the volume of the blue color filter B disposed in the peripheral area of each of the pixel arrays may be increased greater than the volume of the blue color filter B disposed in the central area of each of the pixel arrays. In this way, the light receiving rate of the blue color signals whose wavelength is shorter than that of the green or red color signals may be decreased in the peripheral area, thus improving the imbalance between the light receiving rate of the red color signals whose wavelength is longer, and the light receiving rate of the other color signals, such as the blue color signals and the green color signals. This will be described in detail later with reference to FIGS. 4A and 4B.

Figure 4A:
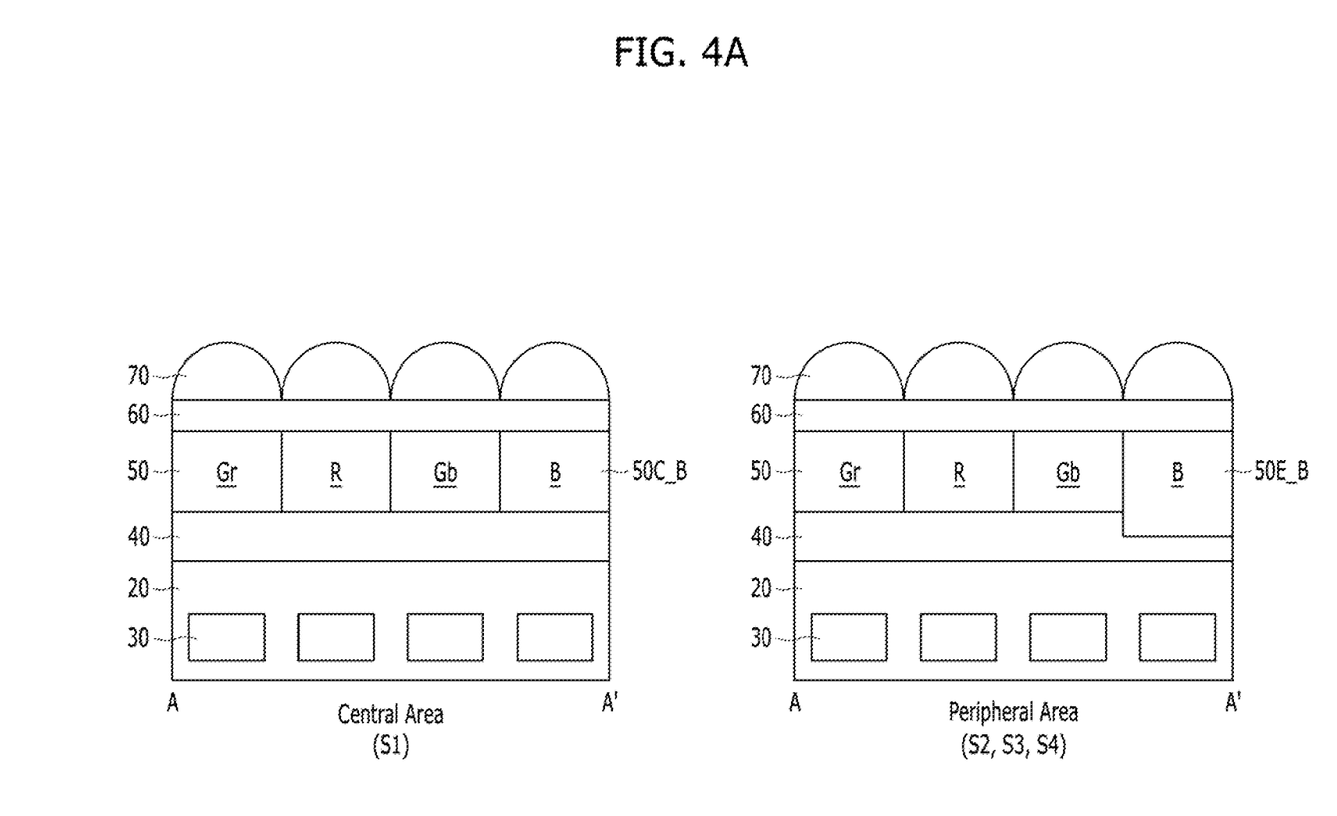
FIG. 4A is a cross-sectional view illustrating an example of an image sensor in accordance with an embodiment of the present invention.

FIG. 4A is a cross-sectional view illustrating an example of the image sensor 100 in accordance with a first embodiment of the present invention. Specifically, FIG. 4A shows a cross-sectional view of the pixel group 110A taken along a line A-A' in FIG. 3.

Referring to FIG. 4A, each pixel group 110A of the image sensor 100 may include a substrate 20, a photoelectric conversion device 30, a first buffer layer 40, a color filter area 50, a second buffer layer 60, and a micro lens 70.

An isolation layer (not shown) for isolating neighboring pixels from the photoelectric conversion device 30 may be formed over the substrate 20 including a plurality of pixels. The first buffer layer 40, the color filter area 50, the second buffer layer 60, and the micro lens 70 may be formed over the substrate.

The substrate 20 may include a semiconductor substrate. The semiconductor substrate may be of a monocrystalline state, and the semiconductor substrate may include a silicon-containing material. That is, the substrate 20 may include a monocrystalline silicon-containing material. For example, the substrate 20 may be a bulk silicon substrate, or a Silicon-On-Insulator (SOI) substrate including a silicon epitaxial layer.

The photoelectric conversion device 30 may include a plurality of photoelectric conversion unit (not shown) that may vertically overlap with each other, and the photoelectric conversion device 30 may be formed to correspond to each of the color pixels. Each of the photoelectric conversion unit may be a photodiode which includes an N-type impurity region and a P-type impurity region. The photoelectric conversion device 30 may be formed in the substrate 20 by penetrating the substrate 20. Also, the photoelectric conversion device 30 may be formed to contact one side of the substrate 20 and to be spaced apart from another side of the substrate 20 by a predetermined distance.

The first buffer layer 40 may be formed over the substrate 20, and under the color filter area 50, that is, formed between the substrate 20 and the color filter area 50. The first buffer layer 40 may function as an anti-reflection layer with respect to the incident light (IL) as well as removing a step difference due to a predetermined structure that is formed in the substrate 20. The first buffer layer 40 may be a single layer of one selected from a group including an oxide layer, a nitride layer, and an oxynitride layer, or a multi-layer where two or more of them are stacked.

The color filter area 50 may be formed over the first buffer layer 40, and include a plurality of color filters Gr, R, Gb and B. The color filters Gr, R, Gb and B may be formed to respectively correspond to the photoelectric conversion device 30, and provide the photoelectric conversion device 30 with the incident light (IL) of the wavelength band required by each pixel. That is, the photoelectric conversion unit of the photoelectric conversion device 30 may receive the incident light (IL) that is color-separated by the color filters Gr, R, Gb and B. The color filters Gr, R, Gb and B may be one single filter selected from a group including a red color filter R, green color filters Gr and Gb, a blue color filter B, a cyan filter, a yellow filter, a magenta filter, a white filter, a black filter, an infrared pass filter, an infrared cut-off filter, and a band pass filter which passes a particular wavelength band, or a multi-filter including two or more of them.

The second buffer layer 60 may be formed over the color filter area 50, and the second buffer layer 60 may be formed of the same material as the material of the first buffer layer 40. In this embodiment of the present invention, the second buffer layer 60 may be used as a planarization layer.

The micro lens 70 may be formed over the second buffer layer 60, and concentrate the incident light (IL) entering from the infrared cut-off filter 200 illustrated in FIG. 2A into the photoelectric conversion device 30 through the color filter area 50.

Referring to FIG. 4A, the volumes of the first green color filter Gr, the red color filter R, the second green color filter Gb, and the blue color filter B may be decided based on the wavelength of the color signals. For example, the volumes of the first green color filter Gr, the red color filter R, and the second green color filter Gb that are included in the central area S1 may be the same as the volumes of the first green color filter Gr, the red color filter R, and the second green color filter Gb that are included in the peripheral areas S2, S3 and S4.

However, in case of the blue color filter, the volume of a blue color filter 50E_B included in the peripheral areas S2, S3 and S4 may be formed to be greater than the volume of a blue color filter 50C_B included in the central area S1. As a result, the light receiving rate of the blue color signals in the peripheral areas S2, S3 and S4 may be decreased while maintaining the light receiving rate of the blue color signals in the central area S1. To increase the volume, the blue color filter 50E_B included in the peripheral areas S2, S3 and S4 may be formed to be thicker than the blue color filter 50C_B included in the central area S1.

The first buffer layer 40 may include a substrate 20 or a silicon epitaxial layer (not shown) in the inside of the substrate 20. If the first buffer layer 40 is a silicon epitaxial layer (not shown) doped with a P-type impurity, the first buffer layer 40 may be able to suppress the generation of dark current on the surface of the substrate. Also, the first buffer layer 40 may be formed of a material having a different refraction index from the blue color filter B.

The embodiment of the present invention may be able to suppress a color shading effect that is caused due to imbalance between the light receiving rate of a red color whose wavelength becomes longer as it goes from the central area S1 of each pixel array of the image sensor 100 to the peripheral areas S2, S3 and S4, and the light receiving rate of the other color signals. To this end, the volume of the blue color filter 50E_B of the peripheral areas S2, S3 and S4 may be formed greater than the volume of the blue color filter 50C_B of the central area S1.

Figure 4B:
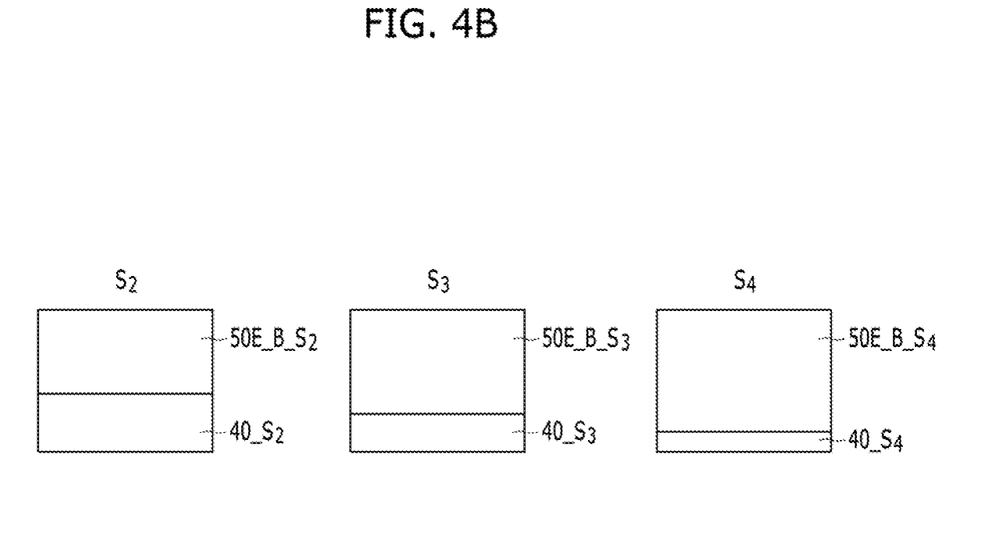
FIG. 4B is a cross-sectional view illustrating a part of peripheral areas, according to a modified example of the image sensor shown in FIG. 4A.

FIG. 4B is a cross-sectional view illustrating the first buffer layer 40 and the blue color filter 50E_B of the peripheral areas S2, S3 and S4, according to a modified example of the image sensor of FIG. 4A.

Referring to FIG. 4B, in which the peripheral areas S2, S3 and S4 are divided into the second peripheral area S2, the third peripheral area S3, and the fourth peripheral area S4 according to the distance from the incident optical axis (C), first buffer layers 40_S2, 40_S3 and 40_S4 and blue color filters 50E_B_S2, 50E_B_S3 and 50E_B_S4 have different thicknesses for each area. Herein, the total thickness of the first buffer layer and the blue color filter in each of the second to fourth peripheral areas S2, S3 and S4 may be uniform regardless of the distance from the incident optical axis (C).

The volume of the blue color filter 50E_B_S3 of the third peripheral area S3 may be greater than the volume of the blue color filter 50E_B_S2 of the second peripheral area S2, and the volume of the blue color filter 50E_B_S4 of the fourth peripheral area S4 may be greater than the volume of the blue color filter 50E_B_S3 of the third peripheral area S3. The thickness of the first buffer layer 40_S3 of the third peripheral area S3 may be thinner than the thickness of the first buffer layer 40_S2 of the second peripheral area S2, and the thickness of the first buffer layer 40_S4 of the fourth peripheral area S4 may be thinner than the thickness of the first buffer layer 40_S3 of the third peripheral area S3.

According to the modified example illustrated in FIG. 4B, the blue color filters B of various volumes are provided according to the distance from the optical axis (C) of the incident light (IL). In this way, the light receiving rate of the blue color pixels positioned in the peripheral areas may be controlled diversely based on the distance from the optical axis (C) of the incident light (IL).

In order to decrease the color shading effect that is caused in the peripheral areas of the pixel arrays of the image sensor, a concave and convex pattern may be formed at a boundary surface between the blue color filters B positioned in the peripheral areas of the pixel arrays and at least one of the first buffer layer 40 and the second buffer layer 60. Accordingly, the volume of the blue color filters B positioned in the peripheral areas may be greater than the volume of the blue color filters B positioned in the central area, so as to decrease the light receiving rate of blue color signals whose wavelength is shorter in the peripheral areas. In this way, the imbalance between the light receiving rate of the red color signals having longer wavelength, and the light receiving rate of the other color signals may be improved. This will be described below with reference to FIGS. 5A and 5B and FIGS. 6A and 6B.

Figure 5A:
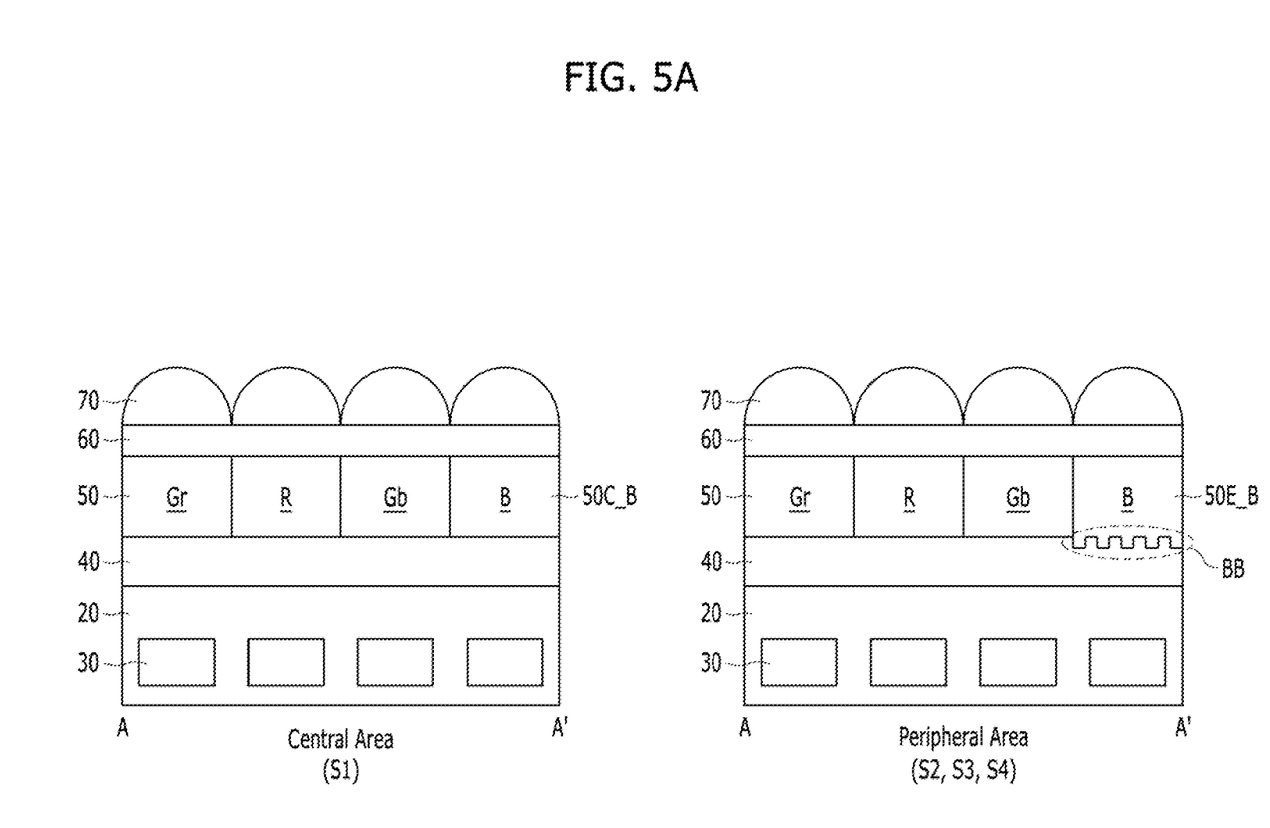
FIG. 5A is a cross-sectional view illustrating an example of an image sensor in accordance with an embodiment of the present invention.

FIG. 5A is a cross-sectional view illustrating an example of an image sensor in accordance with a second embodiment of the present invention. FIG. 5A shows a cross-sectional view of the pixel groups 110A taken along a line A-A' in FIG. 3. Since the constituent elements shown in FIG. 5A are substantially the same as those shown in FIG. 4A, except for a concave and convex pattern BB, further description may be omitted.

Referring to FIG. 5A, the concave and convex pattern BB may be formed at a boundary surface between the first buffer layer 40 and blue color filters 50E_B of the peripheral areas. That is, the first buffer layer 40 of the peripheral areas may have an upper portion having the concave and convex pattern BB, and the blue color filters 50E_B of the peripheral areas may have a lower portion having the concave and convex pattern BB. The blue color filters 50E_B of the peripheral areas may be formed to have a volume greater than that of blue color filters 50C_B of the central area. Accordingly, the concave and convex pattern BB may be able to prevent color shading by increasing the volume of the blue color filters 50E_B positioned in the peripheral areas more than the volume of the blue color filters 50C_B positioned in the central area and thus decreasing the light receiving rate of the blue color signals in the peripheral areas.

Moreover, the boundary surface between the blue color filters 50E_B and the first buffer layer 40 may have the concave and convex pattern BB so as to provide an effect of improving the optical characteristics based on the difference for example, refraction index and transmission rate, in the characteristics of the two materials. To this end, the first buffer layer 40 may be formed of a material having a different refraction index from that of the blue color filters 50E_B.

If the first buffer layer 40 does not exist, the concave and convex pattern BB may be formed on the back side of the substrate 20 or a silicon epitaxial layer (not shown). If the first buffer layer 40 is a silicon epitaxial layer (not shown), the first buffer layer 40 may be a layer doped with a P-type impurity. In this case, generation of dark current may be suppressed on the back side of the substrate.

Particularly, a convex pattern of the upper portion of the first buffer layer 40 may contact a concave pattern of the lower portion of the blue color filter 50E_B, and a concave pattern of the upper portion of the first buffer layer 40 may contact a convex pattern of the lower portion of the blue color filter 50E_B. The blue color filter 50E_B formed over the convex pattern of the upper portion of the first buffer layer 40 may be a low refraction index region having a lower refraction index, and the blue color filter 50E_B formed over the concave pattern of the upper portion of the first buffer layer 40 may be a high refraction index region having a higher refraction index. However, the concept and spirit of the present invention are not limited to it, and the opposite may be included as an embodiment of the present invention according to the structures and materials of the first buffer layer 40 and the blue color filter 50E_B.

The volume of the blue color filter 50E_B may be controlled to be different according to the distance from the optical axis (C) by adjusting the gap between the convex patterns of the upper portion of the first buffer layer 40 according to the distance from the optical axis (C). This will be described later with reference to FIG. 5B.

Figure 5B:
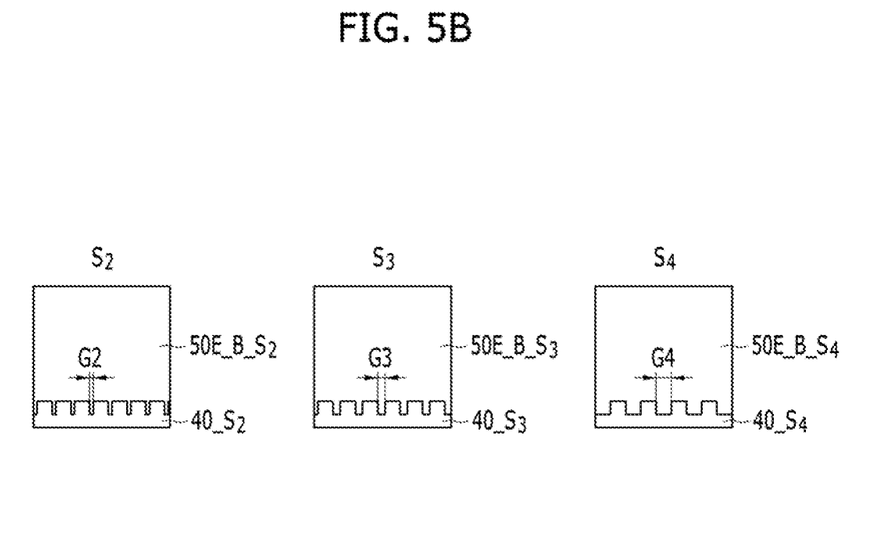
FIG. 5B is a cross-sectional view illustrating a part of peripheral areas, according to a modified example of the image sensor shown in FIG. 5A.

FIG. 5B is a cross-sectional view illustrating the first buffer layer 40 and the blue color filter 50E_B of the peripheral areas S2, S3 and S4, according to a modified example of the image sensor of FIG. 5A.

Referring to FIG. 5B, when the peripheral areas S2, S3 and S4 are divided into the second peripheral area S2, the third peripheral area S3, and the fourth peripheral area S4 according to the distance from the optical axis (C) of the incident light (IL), concave and convex patterns may be formed at boundary surfaces between first buffer layers 40_S2, 40_S3 and 40_S4 and blue color filters 50E_B_S2, 50E_B_S3 and 50E_B_S4, and may have a different gap between the convex patterns of the upper portions of the first buffer layers 40_S2, 40_S3 and 40_S4. Herein, the total thickness of the first buffer layer and the blue color filter may be uniform regardless of the distance from the incident optical axis (C).

A gap G3 between the convex patterns of the first buffer layer 40_S3 in the third peripheral area S3 may be wider than a gap G2 between the convex patterns of the first buffer layer 40_S2 in the second peripheral area S2. A gap G4 between the convex patterns of the first buffer layer 40_S4 in the fourth peripheral area S4 may be wider than the gap G3 of the third peripheral area S3. The volume of the first buffer layer 40_S3 having the gap G3 in the third peripheral area S3 may be smaller than the volume of the first buffer layer 40_S2 having the gap G2 in the second peripheral area S2. The volume of the first buffer layer 40_S4 having the gap G4 in the fourth peripheral area S4 may be smaller than the volume of the first buffer layer 40_S3 having the gap G3 in the third peripheral area S3. The volume of the blue color filter 50E_B_S3 of the third peripheral area S3 may be greater than the volume of the blue color filter 50E_B_S2 of the second peripheral area S2. The volume of the blue color filter 50E_B_S4 of the fourth peripheral area S4 may be greater than the volume of the blue color filter 50E_B_S3 of the third peripheral area S3.

That is, in the embodiment of the present invention, the light receiving rate of the blue color signals may be controlled differently according to the area by controlling the volume of the blue color filter 50E_B differently according to the peripheral area S2, S3 or S4.

Figure 6A:
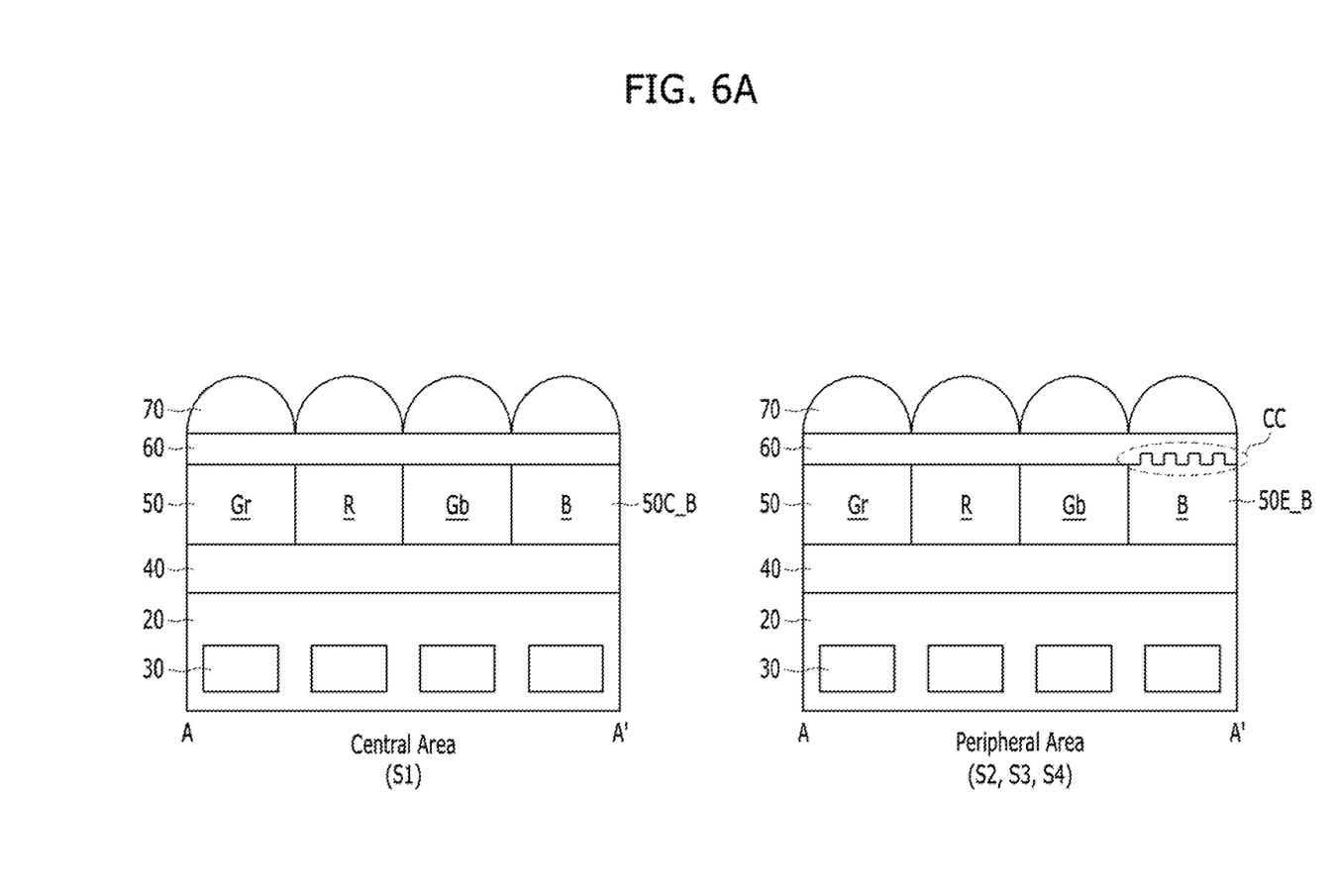
FIG. 6A is a cross-sectional view illustrating an example of an image sensor in accordance with an embodiment of the present invention.

FIG. 6A is a cross-sectional view illustrating an example of an image sensor in accordance with a third embodiment of the present invention. FIG. 6A shows a cross-sectional view of the pixel groups 110A taken along a line A-A' in FIG. 3. Since the constituent elements shown in FIG. 6A are substantially the same as those shown in FIG. 4A, except for a concave and convex pattern CC, further description may be omitted.

Referring to FIG. 6A, the concave and convex pattern CC may be formed at a boundary surface between the second buffer layer 60 and the blue color filters 50E_B of the peripheral areas S2, S3 and S4. That is, the second buffer layer 60 of the peripheral areas may have a lower portion having the concave and convex pattern CC, and the blue color filters 50E_B of the peripheral areas may have an upper portion having the concave and convex pattern CC. At this time, the blue color filters 50E_B of the peripheral areas may be formed to have a volume greater than that of blue color filters 50C_B of the central area. Accordingly, the concave and convex pattern CC may be able to prevent color shading by increasing the volume of the blue color filters 50E_B positioned in the peripheral areas and thus decreasing the light receiving rate of the blue color signals in the peripheral areas.

Moreover, the boundary surface between the blue color filters 50E_B and the second buffer layer 60 may have the concave and convex pattern CC so as to provide an effect for improving the optical characteristics based on the difference for example, refraction index and transmission rate, in the characteristics of the two materials.

Figure 6B:
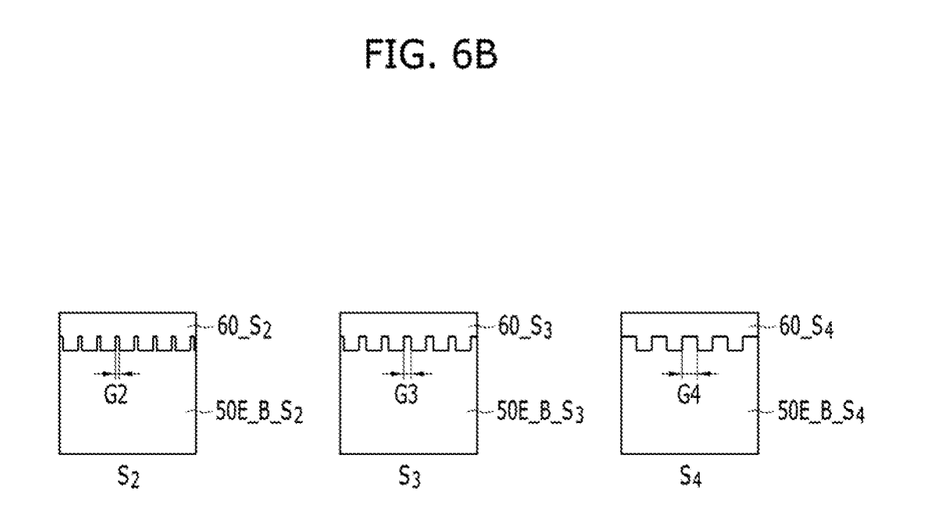
FIG. 6B is a cross-sectional view illustrating a part of peripheral areas, according to a modified example of the image sensor of FIG. 6A.

FIG. 6B is a cross-sectional view illustrating the blue color filter 50E_B and the second buffer layer 60 of the peripheral areas S2, S3 and S4, according to a modified example of the image sensor of FIG. 6A.

Referring to FIG. 6BB, when the peripheral areas S2, S3 and S4 are divided into the second peripheral area S2, the third peripheral area S3, and the fourth peripheral area S4 according to the distance from the optical axis (C) of the incident light (IL), the concave and convex pattern CC may be formed at boundary surfaces between blue color filters 50E_B_S2, 50E_B_S3 and 50E_B_S4 and second buffer layers 60_S2, 60_S3 and 60_S4, and may have a different gap between the convex patterns of the lower portions of the second buffer layers 60_S2, 60_S3 and 60_S4. Herein, the total thickness of the second buffer layer 60 and the blue color filter B may be uniform regardless of the distance from the incident optical axis (C).

A gap G3 between the convex patterns of the second buffer layer 60_S3 in the third peripheral area S3 may be wider than a gap G2 between the convex patterns of the second buffer layer 60_S2 in the second peripheral area S2. A gap G4 between the convex patterns of the second buffer layer 60_S4 in the fourth peripheral area S4 may be wider than the gap G3 of the third peripheral area S3. The volume of the second buffer layer 60_S3 having the gap G3 in the third peripheral area S3 may be smaller than the volume of the second buffer layer 60_S2 having the gap G2 in the second peripheral area S2. The volume of the second buffer layer 60_S4 having the gap G4 in the fourth peripheral area S4 may be smaller than the volume of the second buffer layer 60_S3 having the gap G3 in the third peripheral area S3. The volume of the blue color filter 50E_B_S3 of the third peripheral area S3 may be greater than the volume of the blue color filter 50E_B_S2 of the second peripheral area S2. The volume of the blue color filter 50E_B_S4 of the fourth peripheral area S4 may be greater than the volume of the blue color filter 50E_B_S3 of the third peripheral area S3. That is, in the embodiment of the present invention, the light receiving rate of the blue color signals positioned in the peripheral areas may be controlled differently according to the distance from the optical axis (C) by controlling the volume of the blue color filter 50E_B differently according to the peripheral area S2, S3 or S4.

Figure 7A:
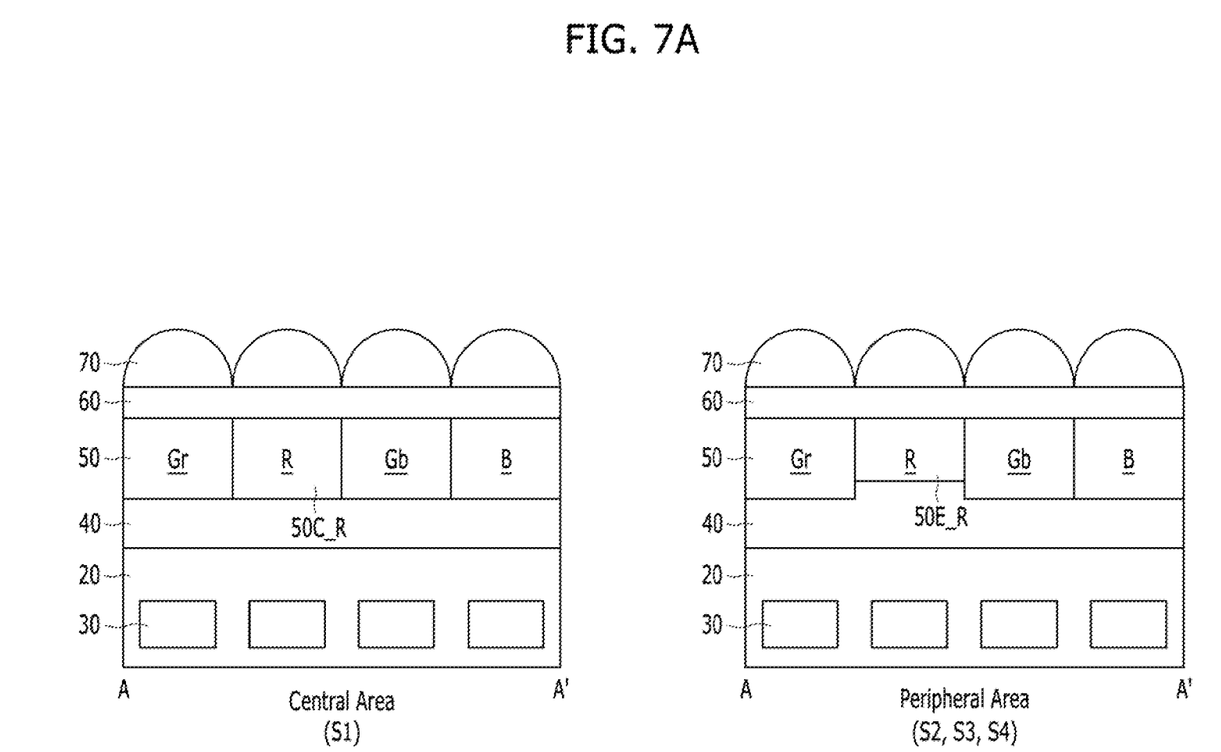
FIGS. 7A and 7B are cross-sectional views illustrating an example of an image sensor in accordance with an embodiment of the present invention.
Figure 7B:
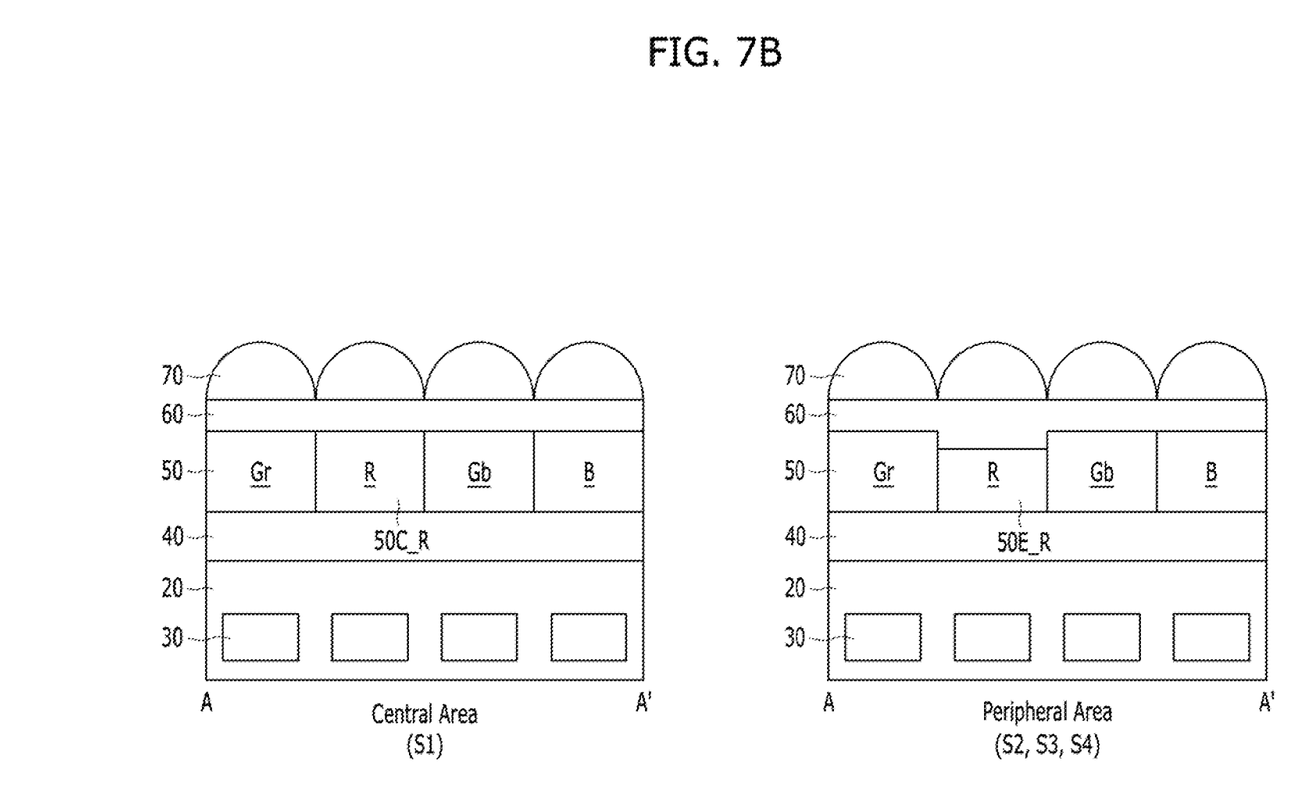

FIGS. 7A and 7B are cross-sectional views illustrating an example of an image sensor in accordance with a fourth embodiment of the present invention. In a peripheral area where light is received at a greater incidence angle than in a central area, a wavelength of red color signals becomes shorter, decreasing the light receiving rate remarkably.

In the fourth embodiment of the present invention illustrated in FIGS. 7A and 7B, in order to prevent the light receiving rate of the red color signals from decreasing remarkably, compared with green color signals and blue color signals, the volume of a red color filter 50E_R of the peripheral areas S2, S3 and S4 is smaller than the volume of a red color filter 50C_R of the central area S1 may be reduced. Thus, the light receiving rate of the red color signals may be increased up to the light receiving rate of the green color signals and the blue color signals, so as to prevent a color shading effect caused in the peripheral areas S2, S3 and S4 of the image sensor. In this case, the volume of the red color filter 50E_R may be reduced by increasing the volume of the first buffer layer 40 of the peripheral areas S2, S3 and S4 as illustrated in FIG. 7A, or by increasing the volume of the second buffer layer 60 of the peripheral areas S2, S3 and S4 as illustrated in FIG. 7B.

Referring to FIG. 7A, the red color filter 50E_R of the peripheral areas S2, S3 and S4 may have a recessed lower portion by a certain depth, compared with green color filters Gr and Gb and a blue color filter B. Referring to FIG. 7B, the red color filter 50E_R of the peripheral areas S2, S3 and S4 may have a recessed upper portion by a certain depth, compared with the green color filters Gr and Gb and the blue color filter B. Thus, referring to FIGS. 7A and 7B, the red color filter 50E_R of the peripheral areas S2, S3 and S4 may have a smaller thickness than the red color filter 50C_R of the central area S1 while the green color filters Gr and Gb and the blue color filter B of the peripheral areas S2, S3 and S4 may have the same thickness as the red color filter 50C_R of the central area S1.

According to the embodiments of the present invention, images with suppressed color shading may be obtained in the peripheral area of an image sensor by controlling the volume or thickness of a color filter in the peripheral area to be different from the volume or thickness of the color filter in the central area.

According to the embodiments of the present invention, an image with effectively suppressed color shading may be obtained by controlling the volumes of color filters that are formed in a plurality of peripheral areas, which is distinguished according to the distance from an optical axis, and which are different from each other.

While the present invention has been described with respect to the specific embodiments, it will be apparent to those skilled in the art that various changes and modifications may be made without departing from the spirit and scope of the invention as defined in the following claims.

What is claimed is:

1. An image sensor, comprising:
   a pixel array where a plurality of pixel groups are arrayed, wherein each of the pixel groups comprises:
   a first pixel suitable for sensing a first color signal that is color-separated through a first color filter; and
   a second pixel suitable for sensing a second color signal that is color-separated through a second color filter and has a longer wavelength than the first color signal,
   wherein a volume of the first color filter positioned in a peripheral area of the pixel array is different from a volume of the first color filter positioned in a central area of the pixel array, or
   wherein a volume of the second color filter positioned in the peripheral area of the pixel array is different from a volume of the second color filter positioned in the central area of the pixel array.

2. The image sensor of claim 1, wherein the first color filter positioned in the peripheral area of the pixel array has a greater volume than the first color filter positioned in the central area of the pixel array.

3. The image sensor of claim 2, further comprising:
   a photoelectric conversion device that is formed under the first color filter; and
   a first buffer layer that is formed between the first color filter and the photoelectric conversion device, and includes a material having a refraction index which is different from a refraction index of the first color filter,
   wherein a concave and convex pattern is formed at a boundary surface between the first color filter positioned in the peripheral area and the first buffer layer positioned in the peripheral area.

4. The image sensor of claim 3, further comprising:
   a second buffer layer that is formed over the first color filter, and includes a material having a refraction index which is different from a refraction index of the first color filter; and
   a micro lens that is formed over the second buffer layer,
   wherein a concave and convex pattern is formed at a boundary surface between the first color filter positioned in the peripheral area and the second buffer layer positioned in the peripheral area.

5. The image sensor of claim 1, wherein the image sensor receives an incident light from an infrared cut-out filter.

6. The image sensor of claim 2, wherein the first color filter positioned in the peripheral area of the pixel array is thicker than the first color filter positioned in the central area of the pixel array.

7. The image sensor of claim 2, wherein the peripheral area includes a first peripheral area where a first incident light enters at a first incidence angle and a second peripheral area where a second incident light enters at a second incidence angle greater than the first incidence angle, and
   wherein a volume of the first color filter formed in the second peripheral area is greater than that formed in the first peripheral area.

8. The image sensor of claim 3, wherein the peripheral area includes a first peripheral area where a first incident light enters at a first incidence angle and a second peripheral area where a second incident light enters at a second incidence angle greater than the first incidence angle, and
   wherein a gap between convex patterns of the first buffer layer in the second peripheral area is wider than a gap between convex patterns of the first buffer layer in the first peripheral area, and a volume of the first color filter formed in the second peripheral area is greater than that formed in the first peripheral area.

9. The image sensor of claim 4, wherein the peripheral area includes a first peripheral area where a first incident light enters at a first incidence angle and a second peripheral area where a second incident light enters at a second incidence angle, which is greater than the first incidence angle, and wherein a gap between convex patterns of the second buffer layer in the second peripheral area is wider than a gap between convex patterns of the second buffer layer in the first peripheral area, and a volume of the first color filter formed in the second peripheral area is greater than that formed in the first peripheral area.

10. The image sensor of claim 1, wherein the second color filter positioned in the peripheral area of the pixel array has a smaller volume than the second color filter positioned in the central area of the pixel array.

11. The image sensor of claim 10, wherein the second color filter positioned in the peripheral area of the pixel array has a smaller thickness than the second color filter positioned in the central area of the pixel array.

12. The image sensor of claim 10, wherein the first color filter positioned in the peripheral area of the pixel array has the same volume as that positioned in the central area of the pixel array.

13. The image sensor of claim 11, wherein the first color filter positioned in the peripheral area of the pixel array has the same thickness as that positioned in the central area of the pixel array.

* * * * *